United States Patent [19]

Siegel et al.

[11] Patent Number: 5,550,963
[45] Date of Patent: Aug. 27, 1996

[54] GRADED DISPLAY OF DIGITALLY COMPRESSED WAVEFORMS

[75] Inventors: Roy I. Siegel; John A. Hengeveld, both of Aloha, Oreg.

[73] Assignee: Tektronix, Inc., Wilsonville, Oreg.

[21] Appl. No.: 352,334

[22] Filed: Dec. 8, 1994

[51] Int. Cl.⁶ .................................................. G06F 15/00
[52] U.S. Cl. ........................................................... 395/140
[58] Field of Search ..................................... 395/140, 142, 395/143; 345/133, 134, 147

[56] References Cited

U.S. PATENT DOCUMENTS

| | | | |
|---|---|---|---|
| 5,097,430 | 3/1992 | Birang | 364/572 |
| 5,434,593 | 7/1995 | Lecklider et al. | 345/134 |
| 5,462,438 | 10/1995 | Becker et al. | 434/430 |
| 5,473,742 | 12/1995 | Polyakov et al. | 395/142 |

*Primary Examiner*—Phu K. Nguyen
*Attorney, Agent, or Firm*—William A. Birdwell; Boulden G. Griffith

[57] ABSTRACT

A visually graded display of digitally compressed waveforms for a digital storage oscilloscope. A histogram is formed by sampling or otherwise resolving a data set of values corresponding to an independent variable to produce a quantized set of values over a selected compression interval of the independent variable. The compression interval represents equal quanta of the independent variable and has associated therewith a set of histogram bins, each containing a number, wherein the number contained within each bin represents a weighted number of hits associated with vectors connecting selected pairs of such dependent variable values, wherein each vector is associated uniquely with one pair. The numbers are weighted for each vector according to drawing techniques, the drawing techniques alone or in combination allowing choices for signal display ranging between retaining maximal signal information, for emulating the display of an analog oscilloscope, or retaining less signal information. The numbers within the histogram bins are representative of an accumulation of vectors within a compression interval and are mapped to a display having a data axis and an independent variable axis. The mapping associates the contents of the histogram bins to a portion of the display and provides for the gradation of a visual characteristic, such as intensity or color, to represent, along the data axis, the data set of values.

21 Claims, 4 Drawing Sheets

GRADED DISPLAY OF DIGITALLY COMPRESSED WAVEFORMS

BACKGROUND OF THE INVENTION

This invention relates to the visual display of digitally compressed waveforms. More particularly, this invention relates to methods and apparatus for increasing on such a display the quantity of information representative of a compressed digital waveform mapped with respect to an independent variable, by providing intensity, color or other visually gradable features to indicate local change in the digital value of the waveform with respect to the independent variable.

In the use of devices for the display of digital data, such as digital oscilloscopes, it is often desired that a "macro" view of the data be provided, that is, long record lengths of compressed data are displayed in their entirety in order to aid in the visualization of the data as a whole, and to facilitate movement therethrough, toward a specific point of interest. Digital storage oscilloscopes ("DSOs") are increasingly being provided with large memories for acquiring large amounts of data to be so viewed. However, it is difficult to discern detail within a display of large amounts of data that are mapped onto a small number of screen widths.

One approach to this problem is to display a selected number of data points comprising a desired compression interval, usually the minimum and maximum values of the signal level therein, and consequently to discard information, with the effect of discarding information being known as decimation. In a columnar display, data within a compression interval produces a vertical bar, representing a vector having endpoints at the minimum and maximum values of signal level within the compression interval. Similarly, other columns representing other compression intervals are filled with vectors drawn between their associated minimum and maximum signal levels and thereby produce a band structure having an envelope of these values. This envelope represents all the information displayed.

Another approach to the problem of displaying a large amount of data in a relatively small screen width that has been utilized for the display of waveforms as a function of either time or frequency is to form a histogram of the number of times (hereinafter referred to as "hits") a digital signal within a given compression interval is acquired at a particular level (hereinafter referred to as a "histogram bin"). The data within the compression interval is then mapped entirely to a quantum of one of the axes of the display, usually a column of one pixel width, for the display of compressed waveform signal levels as a function of time or frequency.

One approach to performing the aforementioned mapping is exemplified by Bales, et. al., U.S. Pat. No. 4,890,237, hereinafter incorporated by reference in its entirety. In Bales, et al., discrete values of data within the compression interval are represented by corresponding points on the columnar display having a brightness proportional to the number of hits. While such a display provides more information than a columnar display of a vector representing only the minimum and maximum values over an interval, a number of unhelpful or misleading visual cues result from this mapping that may be appreciated by consideration of the display of a sine wave. If samples of a sine wave are acquired at a frequency that perfectly and evenly divides the frequency of the sine wave, the compressed result will be a column of bright spots at the sample values and darkness therebetween. The spacing of these spots will provide some visual indication of the slew rate of the sine wave, though not a particularly good one for either very low sampling rates, where there may be only a few spots representative of the period of the sine wave, or very high sampling rates, where the space between dots becomes less discernible. Further, if the acquisition frequency above differs slightly from a perfect and evenly dividing value, a moire pattern will result when adjacent columns representing other compression intervals are displayed. This pattern will tend to obliterate even the limited visual cues available with a perfect sampling.

Analog oscilloscopes have also been used, and are often preferred, for compressing and viewing long waveforms, because their method of operation inherently provides for the display of desirable information not inherently displayed by conventional DSOs. When the time-base on an analog scope is increased—meaning that the time axis displays a longer time—a waveform is "compressed" by its method of operation, that is, the horizontal or time resolution as a function of the speed of the ramp utilized for horizontal deflection of the CRT beam is limited. The resolution on the time axis may be thought of as a compression interval analogous (though continuous; not quantized) to that described above for a DSO. Though the time axis changes for data slew rates higher than the resolution of the time axis are visually undiscernible, intensity gradations within a column corresponding to the compression interval remain discernible. Signals that dwell on or about a given signal level within the compression interval keep the electron beam dwelling on the same location of the screen and so increase the perceived brightness of phosphorescence at that location by targeting those phosphors with greater frequency. Consequently, within a display column corresponding to a compression interval in an analog oscilloscope, values of the signal at which the signal dwells or from which the signal slews more slowly will be brighter than values at which the signal spends less time and from which the signal transitions more quickly.

DSOs have well-known advantages over their analog counterparts that makes their use preferable for many applications. For example, DSOs have the ability to postprocess, save, colorize, take many independent views of acquired data, and create persisting displays of a "single shot" of data. Therefore, it would be desirable to provide a DSO which has the intensity variation advantages of analog oscilloscopes.

SUMMARY OF THE INVENTION

The aforementioned problems of DSOs are solved and the aforementioned advantage of analog oscilloscopes is achieved in the present invention by providing a graded DSO display of digitally compressed waveforms. A histogram is formed by sampling or otherwise resolving a data set of values corresponding to an independent variable to produce a quantized set of values over a selected interval of the independent variable, that is, the compression interval. The compression interval represents equal quanta of the independent variable and has associated therewith a set of histogram bins, each containing a number, wherein the number contained within each bin represents a number of hits associated with vectors connecting selected pairs of such dependent variable values, wherein each vector is associated uniquely with one pair.

The numbers within the histogram bins are representative of an accumulation of vectors within a compression interval and are mapped to a display having a data axis and an independent variable axis. The mapping associates the contents of the histogram bins to a portion of the display and provides for the gradation of a visual characteristic, such as intensity or color, to represent, along the data axis, the data set of values. Further, the portion of the display to which the histogram bins of a compression interval are mapped is a quantum of the display axis representative of the independent variable. The visual characteristic is held substantially invariate over the aforementioned portion of the display, for mapping entirely the vector information within a compression interval to the quantum of the display axis.

A vector hit, corresponding to adding a number representative of the vector to the associated set of histogram bins, is produced according to a vector drawing technique. The vector drawing technique employs an analog drawing technique and an inflection drawing technique to be utilized in a selected combination, providing selectable incorporation of features associated with each and thereby selectably spanning the space between the analog and inflection drawing techniques.

The analog drawing technique increments a histogram bin by a value that is a function of the inverse of the vector magnitude between the associated pair of representational values. Consequently, the technique retains maximum information, retaining and displaying gradations of visual indicators representative of the rate of change of the representational values with respect to the independent variable.

The inflection drawing technique increments a histogram bin by a fixed value for vectors connecting inflection points and consecutive repeated points, that is, consecutive points having a zero numeric difference in representational values. Consequently, intermediate points between inflection points, other than consecutive repeated points, are ignored and rate of change information is not displayed.

Combining the analog drawing technique and the inflection drawing technique provides a hybrid technique that allows for arbitrary adjustment of the amount of displayed information content desired between that afforded by each technique alone, and thereby adjusts memory storage requirements and computation speed as well.

Therefore, it is a principal object of the present invention to provide a novel and improved apparatus and method for producing a graded display of digitally compressed waveforms.

It is another object of the present invention to provide such an apparatus and method which provides intensity gradations corresponding to signal values within a compression interval.

It is yet another object of the present invention to provide such an apparatus and method which provides color distinctions corresponding to signal values within a compression interval.

It is a further object of the present invention to provide such an apparatus and method which provides selectable amounts of displayed information content.

It is still a further object of the present invention to provide such an apparatus and method which provides for a selectable amount of compressed data storage.

It is yet a further object of the present invention to provide such an apparatus and method which provides selectable amounts of computation speed.

The foregoing and other objects, features and advantages of the invention will be more readily understood upon consideration of the following detailed description of the invention, taken in conjunction with the accompanying drawings.

BRIEF DESCRIPTION OF A PREFERRED EMBODIMENT

Figure 1:
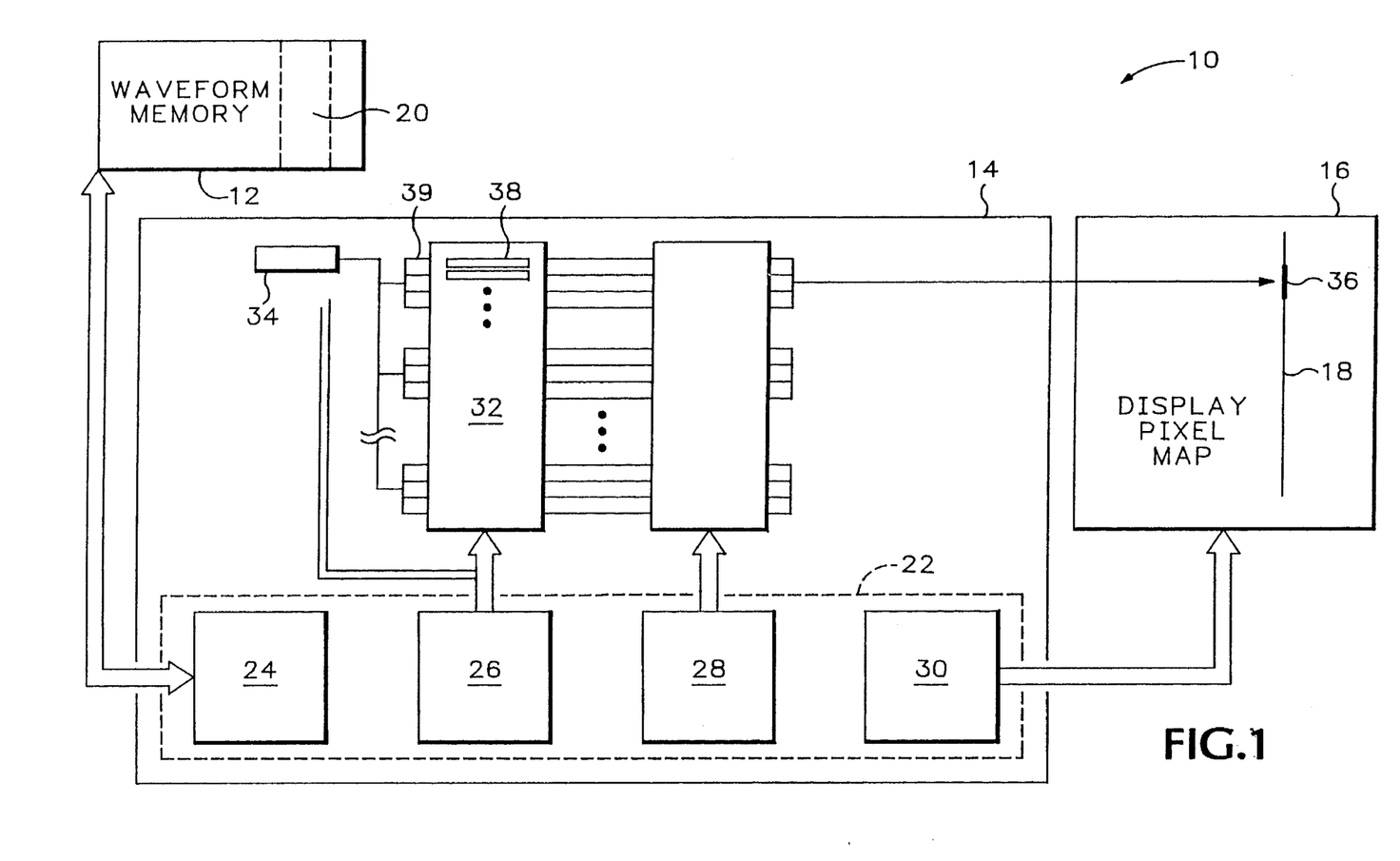
FIG. 1 is a block diagram of a preferred embodiment of a graded display of digitally compressed waveforms according to the present invention.

Referring to FIG. 1, a preferred embodiment of a graded display of digitally compressed waveforms 10 according to the present invention includes a waveform memory 12, a processor 14, and a display pixel map 16. The processor 14 addresses the waveform memory 12 and displays a processing result at column 18 having pixel width on the display pixel map 16. Preferably, the graded display of digitally compressed waveforms 10 resides within a DSO, however it may reside in or be utilized in conjunction with any display device capable of displaying digital waveforms.

The waveform memory 12 is adapted to receive a waveform (not shown) having a record length of data. The waveform memory 12 comprises a plurality of compression intervals 20 having selectable lengths. Preferably the lengths of the compression intervals 12 are fixed in a consistent manner, particularly to equal the record length divided by the number of display quanta available within the display pixel map 16 along an axis of an independent variable associated with the waveform memory 12. In a preferred embodiment, the compression intervals 12 are fixed to equal the record length divided by the number of horizontal pixels corresponding to the display pixel map 16, however other choices of display quanta and independent variable axis orientation may be made. Further, the record lengths could be user or otherwise remotely selected without departing from the principles of the invention. Further, the waveform is preferably digitized, but an analog waveform could be stored in the waveform memory 12 and digitized within the processor 14 or by other means known in the art without departing from the principles of the invention.

The processor 14 includes a control unit 22, comprising a waveform memory addressing/control unit 24, an adder enable logic and increment generator 26, an intensity and color map control unit 28 and a pixel map control unit 30.

The addressing/control unit 24 addresses the waveform memory and thereby causes the processor 14 to receive the data corresponding to the compression interval 20. The addressing/control unit 24 preferably addresses the entire waveform memory 12 serially, however, compression intervals 20 may be accessed in parallel without departing from the principles of the invention.

The adder enable logic and increment generator 26 then resolves the data within the compression interval into vectors according to a drawing technique that is described below in connection with FIGS. 2, 3 and 4. The generator 26 provides a resulting increment value to an increment register 34, causes the contents of register 34 to be placed on a bus 39, and enables the adder and memory units 38, within the adder and memory array 32, which store values associated with a range of pixels disposed vertically along the display pixel map 16 at column 18, add the increment value and store the result for presentation to the intensity and color map unit 28.

The adder and memory units 38 corresponding to the pixels comprising the display of one column 18 (and one compression interval 20) are preferably enabled in parallel by the adder enable logic and increment generator 26; however, vectors 36 are preferably calculated and enabled serially. The adder and memory units 38 corresponding to the pixels comprising the display of one column 18, corresponding to one compression interval 20 may also be enabled serially, to decrease chip area by employing fewer adder and memory units 38, and units 38 corresponding to the display of each compression interval 20 may be enabled in parallel, for greater speed. Further, multiple columns 18 may be mapped in parallel.

Also preferably there is one adder and memory unit 38 within the adder and memory array 32 corresponding to each vertically disposed pixel. More pixels may be associated with an adder and memory unit 38, however, without departing from the principles of the invention. The number of adders employed is a contributing factor to the speed of drawing the vector 36, which will be slower if a single adder is used sequentially for adder and memory units 38. This will be the case, for example, if a method according to the present invention is implemented in software and the arithmetic logic unit of the processor running such software functions as the single adder. It will also be appreciated by one of ordinary skill in the art that, where a single adder is utilized, the speed of drawing the pixels of which vectors 36 are comprised is not only slower but is severely data-dependent, because the variable times required for addition for each pixel are added seriatim.

The intensity and color map control unit 28 accepts the data provided by the adder array 32, and maps that data onto a display having associated with each pixel a smaller dynamic range. For example, four bits of information may provide sixteen different colors or intensities, a resolution found sufficient to usefully grade the display at acceptable cost. To perform this mapping, the intensity and color map control unit 28 receives the data processed according to the aforementioned drawing technique and further proportionately scales the result to fit the smaller dynamic range mentioned above.

The resulting data is then provided to the pixel map control unit 30 for mapping to the display pixel map 16, which may be accomplished with well-known techniques. The pixel map control unit 30 is preferably a portion of a display ASIC. The intensity and color map control unit 28, through the pixel map control unit 30, preferably draws an entire column 18 at one time with a set of intensities or colors associated with each pixel therein determined by the accumulated vector data or histogram hits associated therewith, in the aforedescribed manner.

Figure 2A:
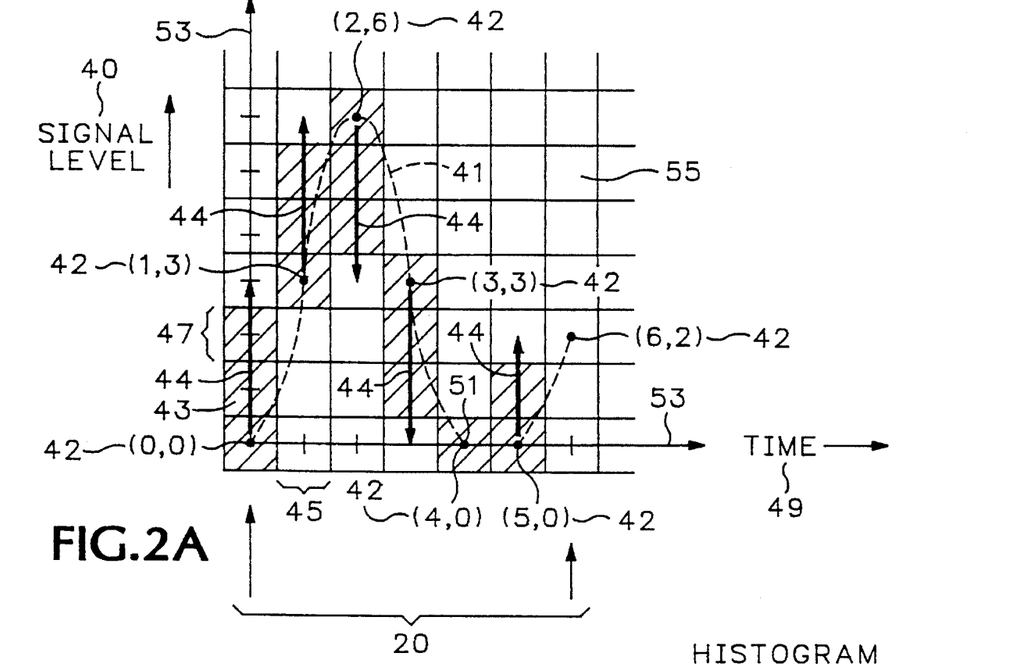
FIG. 2A is an exemplary representation of an arbitrary data set analyzed by a first technique according to the principles of the present invention.

Referring to FIG. 2A, in order to better understand the operation of the aforedescribed apparatus, a discrete time plot of a digitized signal 41 over a designated compression interval 20 is shown having seven (N=7) data points 42: (0,0), (1,3), (2,6), (3,3), (4,0), (5,0) and (6,2) in time sequence according to a set of data axes 53. This signal is to be analyzed for mapping to a display by an analog drawing technique according to the present invention.

A first drawing technique, hereinafter referred to as the analog drawing technique because it provides output most closely resembling the output of an analog oscilloscope, increments a selected adder and memory unit 38 by a value that is a function of the inverse of the vector vertical distance between an associated pair of adjacent data points 42. This vertical distance will be mapped to a display having discrete pixels, so a data point 42 is associated with a unit "box" 43, each box 43 cooperating to form a grid 55 and having a unit width 45 and a unit height 47. The unit width 45 corresponds to a quantum of the independent variable, here time 49, while the unit height 47 corresponds to a quantum of the signal level 40. The unit boxes 43 represent the pixels of display map 16 and correspond directly to the values in memory array 32. The unit boxes are centered on the scale of axes 53 so that data points 42 defined, as above, according to the axes 53, are located at the center of a corresponding box 43.

Six pairs (N-1) of adjacent data points 42 of the data of FIG. 2A are formed, so that data point 42 (0,0) is paired with horizontally adjacent data point 42 (1,3); (1,3) is paired with (2,6); and so on. A vertical distance "d" in signal levels associated with each pair is determined by taking the difference in signal levels, on vertical signal axis 40, between the adjacent data points 42 comprising the pair. Thus, for example, the pair (0,0) and (1,3) define a distance d of "3," and the pair (5,0) and (6,2) define a distance d of "2."

The distances d associated with respective pairs of horizontally adjacent data points 42 are drawn as vectors 44 along an axis in the signal direction 40 having a length equal to d. The vectors 44 are associated with a stacking of the unit boxes 43. The number and location of vectors 44 and their distances d will be utilized to produce a value for each unit box 43 associated with a vector by a histogram and weighting scheme as described below. The value for each box 43 is utilized to produce a graded visual characteristic for a pixel or pixels of the display map 16 corresponding thereto.

The vectors 44, considered as vertical lengths, can be seen to comprise all vertical values inclusive of the values corresponding to the data of each data point 42 of the pair. Accordingly, the vector 44, representative of the pair (0,0) and (1,3), comprises the vertical distance having a set of signal levels 0, 1, 2 and 3, where 0 is a first end value and 3 is a last end value. Similarly, the vector 44, representative of the pair (1,3) and (2,6), comprises the vertical distance having a set of signal levels 3, 4, 5 and 6, where 3 is a first end value and 6 is a last end value. However, both of the above described vectors 44 have length d=3, and correspond to three of the aforedescribed unit boxes 43, so their representation may be derived from the set of signal levels by including one but not both of the first and last end values of the four signal levels above.

Accordingly, a vector/box association scheme is followed whereby unit boxes are apportioned between two vectors adjacent in time, to prevent double counting of a box 43 associated with the end of one vector 44 and the beginning of a subsequent vector 44. For any pair of adjacent data points 42 (x1, y1) and (x2, y2), if y1<y2, the last end value is equal to y2−1; if y1>y2, the last end value is equal to y2+1. Accordingly, for the vector 44 comprising the vertical distance having signal levels 0, 1, 2 and 3, y1=0 and y2=3, so that y1<y2, and the last end value is 3−1=2; therefore, 3 is discarded from the set of signal levels 0, 1, 2 and 3. This process leaves a set of signal level values 0, 1 and 2 represented by the vector 44 associated with the first pair of data points 42 and having length d=3. The unit boxes 43 are then identified as having centered therein one of the signal values in the set. Consequently, unit box 43 is identified with the signal level 1, and the vector 44 corresponding to the pair of data points 42 at (0,0) and (1,3) includes the unit box 43 and two similarly determined unit boxes corresponding to the signal levels 0 and 3 within the set of signal values 0, 1 and 2. Unit boxes 43 shown as shaded in FIG. 2A are drawn according to this vector/box association scheme.

Where horizontally adjacent data points 42 have y2<y1, so that the signal is negative going, as for the pair (2,6) and (3,3), the set of signal values according to the above described vector/box association scheme contains the values 6, 5 and 4 (y1 to y2+1), and the unit boxes associated with the vector 44 defined by the above pair are centered on the above values of signal level.

Where horizontally adjacent data points 42 have y2=y1, and therefore have repeated values of the signal level, as for the pair (4,0) and (5,0), a pseudo vector 51 having length zero is identified with a unit box 57. Where (x1, y1) is followed by (x2, y1), the unit box 43 centered at (x1, y1) is associated with the pseudo vector 51. It will be noted throughout that, though treated as a vector computationally herein, pseudo vectors may not be generalized as vectors for purposes of the present invention.

It may now be appreciated that the vector/box association scheme provides a method for ensuring that signal level values representing the ends of vectors are not repeated artificially when vectors representing adjacent pairs of points are displayed. When a consistent scheme is followed, signal level values that are not counted as belonging to one vector are incorporated into the next vector, so that, only at the ends of the entire data record does the scheme, if followed, delete data. Accordingly, for the scheme given above, the y2 value corresponding to the last data point 42 in the record is not adjusted by subtractions or additions as described, so that signal levels representing the last vector 44 are not deleted, and, when a scheme reversing the role of the first end value and the last end value described above is utilized, the first data point 42 in the record is so relieved of the operation performed under the scheme.

Notwithstanding the above, the vectors 44 will be referred to herein as being represented by an ordered pair of coordinates, wherein the first coordinate of the pair is the signal level at the first data point 42 of the vector, and the second coordinate is the signal level at the second data point 42 of the vector, with respect to the axes 53, and wherein the vector 44 is parallel to the signal level axis 40, so that the vectors 44 have a magnitude, and have a direction and position along the signal level axis 40 defined by the coordinates of the ordered pair. Representations of the six vectors 44 associated with the signal 41 within the compression interval 20 are accordingly: (0,3), (3,6), (6,3), (3,0), (0,0) and (0,2).

FIG. 2A shows these vectors 44 drawn from the first point in time of the pair of data points 42 for convenience. It should be noted that the derivation of the vectors 44 may be performed employing alternative computation or identification schemes and, particularly, the vector/box association scheme given above makes an arbitrary choice within the means of association of a set of values with either a vector 44 or a unit box 43.

The data of FIG. 2A, operated upon in the aforedescribed manner, is consequently represented by six vectors 44 (only five vectors may be discerned, since pseudo vector 51, at (4,0) has zero length). Each vector retains location information only with respect to the signal level direction 40, while losing, within a compression interval 20, all associated time information. While a signal level, corresponding to a "y" axis, and a time, corresponding to an "x-axis" has been chosen as illustrative of the method, it will be readily appreciated that any independent variable, for example, frequency, and any dependent variable, corresponding to any choices of axes respectively, including a z-axis, may be utilized without departing from the principles of the invention.

Figure 2B:
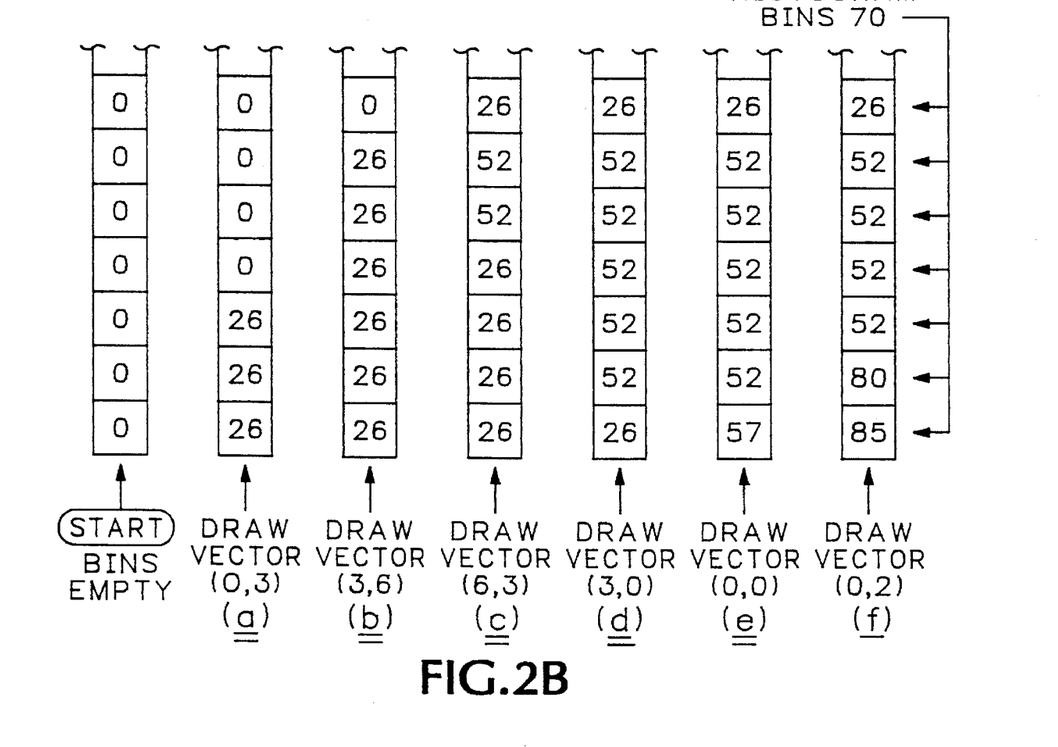
FIG. 2B is an exemplary representation of the production of a histogram of the data set of FIG. 2A, according to the present invention.

Referring to FIGS. 2A and 2B, a count of the number of hits for each vector is determined whereby a set of vertically disposed histogram bins 70, corresponding to a row of unit boxes 43 retain a value associated therewith, where a row is defined here to be along the time axis 49. For the data of FIG. 2A there are seven such vertically disposed histogram bins, corresponding to seven horizontal rows of unit boxes 43. The histogram bins 70 are initialized prior to drawing the vectors to contain the value zero. To draw a first vector 44, the vertically disposed unit boxes 43 associated therewith (shown shaded in FIG. 2A) are assigned a weight corresponding thereto as described below. These weights are entered into the associated histogram bins 70. To draw any subsequent vector 44, the weights calculated therefor are assigned to the unit boxes 43 associated therewith and are summed into the associated histogram bins 70. Each vector 44 is drawn in the aforedescribed manner.

FIG. 2B shows the development of the histogram bins 70 for the data of FIG. 2A as each of the six vectors 44 within the compression interval 20 are drawn, at stages (a),(b),(c), (d),(e) and (f) of drawing, during each stage, the vectors (0,3),(3,6),(6,3), (3,0),(0,0) and (0,2) respectively. The histogram bins 70 will be noted to contain numbers that have the aforementioned weights. All six vectors 44 have been drawn at stage (f), wherein a completed histogram for the compression interval 20 is formed by the numbers contained within each of the histogram bins 70 at the conclusion of stage (f) and is ready for mapping to the display pixel map 16 (FIG. 1).

A weighted value for each vector 44 is determined, which is inversely proportionate to the length thereof, preferably according to a weighting function of the form (weight)/(1+ (weight 1)×d/(dynamic range)). The dynamic range and weight have been usefully fixed to equal 511 and 31 respectively. It can be noticed that a distance d of 511 maps to one (1), while a distance d of zero maps to (weight) in accordance with the weighting function, however, any other weighting scheme may be employed. With the aforementioned weighting scheme, the longer the vector, and thus the greater the rate of change of the signal, the smaller will be the weight accorded to that vector on the display.

To provide vector weighting values, the adder enable logic and increment generator 26 (FIG. 1) provides an increment value corresponding to the weight for that vector. Accordingly, the vector (0,0) is weighted by a value of 31, the vectors (0,3), (3,6),(6,3) and (3,0) are weighted approximately by a value of 26, and the vector (0,2) is weighted approximately by a value of 28.

The vector weighting values corresponding to the vectors 44 are associated with a corresponding and proportionate value for a gradable visual characteristic for display of the vectors 44. The vector 44 at (3,6), for example has a smaller weighting value than the vector 44 at (0,2), and therefore, when ultimately folded into the compression interval and mapped as a portion of the histogram hits for all the vectors 44 within the compression interval, will contribute a lesser degree of the gradable visual characteristic. Preferably, the gradable visual characteristic is chosen to be intensity; however, it may be a color or some other visual characteristic.

In FIG. 2B, stage (a), the first vector 44 (0,3) is drawn having a value of weight equal to 26 (as determined above for a vector of length d=3) by assigning each vertically disposed unit box 43 (FIG. 2A) associated therewith a value of weight equal to 26 and entering those values into corresponding histogram bins 70, so that the bottom three histogram bins (histogram bins 70 and unit boxes 43 will be identified herein as numbered from the bottom)—corresponding to the first, second and third vertically disposed unit box 43 shown shaded in FIG. 2A and associated with the first vector 44 (0,3)—have entered therein a value of weight equal to 26.

In FIG. 2B, stage (b), the second vector 44 (3,6) is drawn having a value of weight also equal to 26 and the histogram bins 70 identified with the unit boxes 43 that are shown shaded in FIG. 2A and are associated with the second vector 44 (3,6)—the fourth, fifth and sixth histogram bins—have entered therein a value equal to 26.

In FIG. 2B, stage (c), the third vector 44 (6,3) is drawn having a value of weight also equal to 26. The unit boxes shown shaded in FIG. 2A as corresponding to the third vector 44 (6,3) have assigned the value 26 and this value is to be summed into the associated histogram bins 70—the fifth, sixth and seventh histogram bin 70. Consequently, in the fifth histogram bin 70, the value 26 is added to the previously existing value 26 for a summed value of 52. Similarly, the sixth histogram bin 70 has a summed value of 52. The seventh histogram bin, however, has a summed value of only 26 because the previous bin value was zero.

In FIG. 2B, stage (d), the fourth vector 44 (3,0) is drawn having a value of weight also equal to 26. The second, third and fourth unit histogram bins 70 can be seen to correspond to the unit boxes 43 shaded in FIG. 2A as being associated with the fourth vector 44. Consequently, the value 26 is summed into those histogram bins, giving the result shown in FIG. 2B.

In FIG. 2B, stage (e), the fifth vector 44 (0,0) is drawn having a value of weight equal to 31 as determined above. The first histogram bin 70 corresponds with the unit box 57 shaded in FIG. 2A to indicate association with the fifth vector 44. The value 31 is consequently added to the value 26 existing in the first bin 70 for a resulting value of 57.

In FIG. 2B, stage (f), the sixth vector 44 (0,2) is drawn having a value of weight equal to 28 as determined above. The first and second histogram bins 70 correspond with the unit boxes 43 shaded in FIG. 2A to indicate association with the sixth vector 44. The value 28 is consequently added to the value 57 previously existing in the first bin 70 for a resulting value of 85, while the value 28 is added to the value 52 previously existing in the second bin 70 for a resulting value of 80.

After all vectors are drawn a histogram comprising the bins 70 is completed for the compression interval 20 containing the data of FIG. 2A. The values contained within the bins are then mapped to a column of the display pixel map 16 (FIG. 1).

Figure 2C:
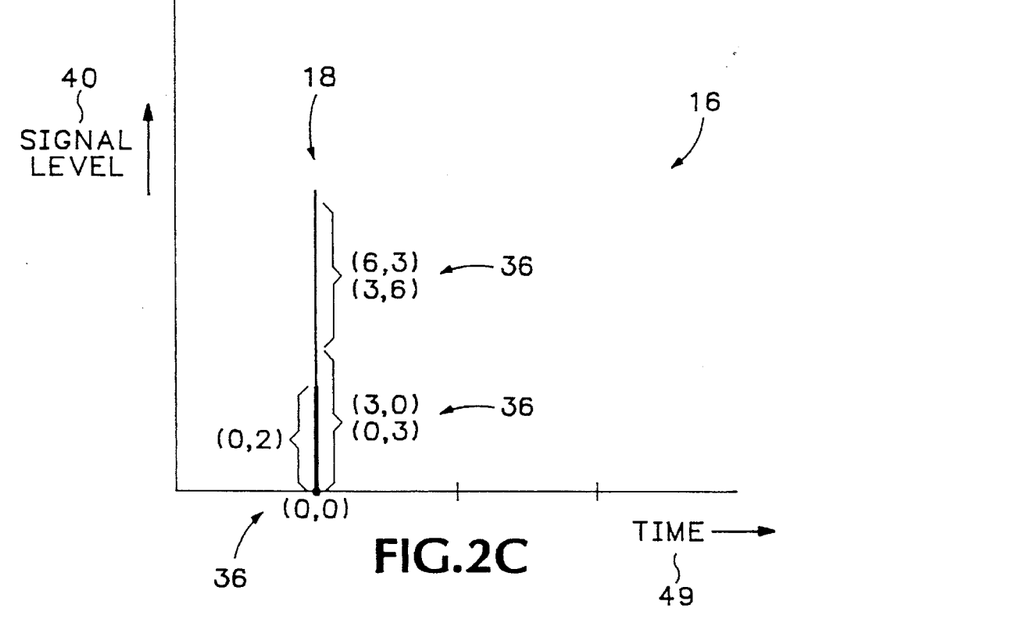
FIG. 2C is an exemplary representation of a display of the data set of FIG. 2A, according to the present invention.

Referring to FIG. 2C, the column 18 of the display pixel map 16 is shown having the six vectors 44 mapped thereto as the vectors 36. The vectors 36 comprise pixels within the display column 18 each having a degree of gradable visual characteristic determined by the value of their associated histogram bin 70.

Figure 3A:
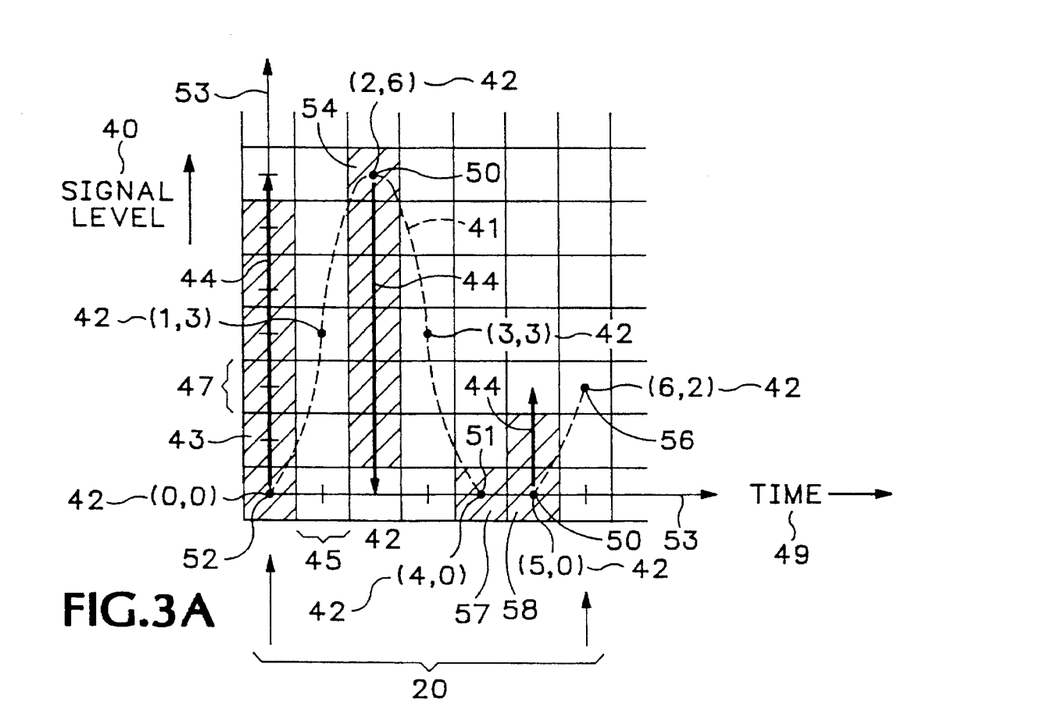
FIG. 3A is an exemplary representation of an arbitrary data set analyzed by a second technique according to the principles of the present invention.

Referring to FIG. 3A, the signal 41 (also shown in FIG. 2A), having data points 42 as described above, may alternatively be analyzed for mapping to a display according to an inflection drawing technique according to the present invention, as described below.

The inflection drawing technique increments a selected adder and memory 38 by a fixed value for vectors connecting inflection points, and consecutive repeated points, that is, consecutive points having a zero numeric difference in representational values. Referring to FIG. 3A, two inflection points 50 will be noted in the data of the signal 41, over the compression interval 20, where inflection points are identified as points demarcating a change in signal direction with respect to the signal axis 40. With this definition, there is an ambiguity in which of two consecutive data points 42 having the same y-value (such as (4,0) and (5,0) here) is identified as the inflection point. The ambiguity may be resolved by proceeding to consider data points 42 in the direction of an increasing value of the independent variable, and recognizing the first of such points as a vector (0,0), or may be resolved in some other way.

Pairs of points are formed by the origin 52 of the compression interval 20 and an adjacent inflection point 54, and a terminus 56 of the compression interval 20 and an adjacent inflection point 58, respectively. If there is more than one inflection point 50 within a compression interval 20, then inflection points that are nearest neighbors are also paired, so that, in connection with FIG. 3A, the data (0,0) is paired with the data (2,6), the data (2,6) is paired with the data (4,0), and the data (5,0) is paired with the data (6,2), to form three vectors 44 in the manner described above: (0,6), (6,0) and (0,2) having lengths d as defined above of 6, 6 and 1, respectively. The vectors 44 associated with the data of FIG. 3A further include the pseudo vector 51 having length d=0 and representing a pair of consecutive points ((3,0) and (4,0)) having the same representational value, for a total of four vectors 44.

Unit boxes 43 are associated with each vector 44 in the same manner as aforedescribed for the analog drawing technique and are shown shaded in FIG. 3A.

As mentioned above in connection with FIG. 2, each vector retains location information only with respect to the signal level direction 40, while losing all associated time information. It should be noted that a signal level, corresponding to a "y" axis, and a time, corresponding to an "x-axis," has been chosen as illustrative of the method. However, it will be readily appreciated that any dependent variable, for example, frequency, and any independent variable, corresponding to any choices of axes respectively, including a z-axis, may be utilized without departing from the principles of the invention.

Figure 3B:
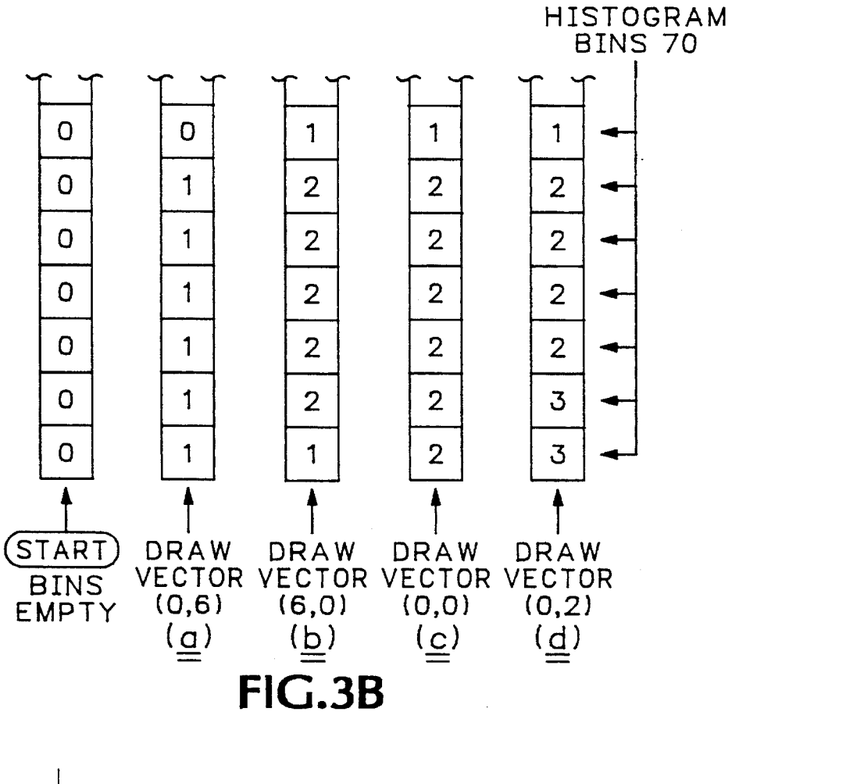
FIG. 3B is an exemplary representation the production of a histogram of the data set of FIG. 2A, according to the present invention.

Referring to FIGS. 3A and 3B, a count of the number of hits for each vector is determined whereby a set of vertically disposed histogram bins 70, each corresponding to a row of unit boxes 43 where a row is defined here to be along the time axis 49, retain a value associated therewith, as for the analog drawing technique described above. Weights are associated with each vector 44 and assigned to associated vertically disposed unit boxes 43, and in order to draw a vector 44, the weights for each unit box 43 are summed into the corresponding histogram bin 70 in the manner described above for the analog drawing technique.

FIG. 3B shows the development of the histogram bins 70 for the data of FIG. 3A as each of the aforedescribed four vectors 44 are drawn, at stages (a), (b), (c), and (d) of drawing, during each stage, the vectors (0,6), (6,0), (0,0) and (0,2), respectively. The histogram bins will be noted to contain numbers that are the aforementioned weights. All four vectors 44 have been drawn at stage (d), wherein a completed histogram for the compression interval 20 is formed by the numbers contained within each of the histogram bins 70 at the conclusion of stage (d) and is ready for mapping to the display pixel map 16 (FIG. 1).

A weighted value for each vector 44 is produced as a fixed value for each vector. The fixed value can be any convenient number, and is preferred to be one (1). To provide vector weighting values, the adder enable logic and increment generator 26 (FIG. 1) provides an increment signal corresponding to the constant value.

The fixed value associated with each vector 44 is associated with a corresponding and proportionate value for a gradable visual characteristic for display thereof. Preferably, the gradable visual characteristic is chosen to be the intensity of the displayed vector; however, it may be a color or some other visual characteristic.

In FIG. 3B, stage (a), the first vector 44 (0,6) is drawn having a value of weight equal to one by assigning each vertically disposed unit box 43 (FIG. 3A) associated therewith a value of weight equal to the fixed value of one and entering those values into corresponding histogram bins 70, so that the six histogram bins 70 (histogram bins 70 will be identified herein as numbered from the bottom), identified with the vertically disposed unit boxes 43 shown shaded in FIG. 3A associated with the first vector 44 (0,6), have entered therein a value of weight equal to one.

In FIG. 3B, stage (b), the second vector 44 (6,0) is similarly drawn having a value of weight equal to one. Unit boxes 43 shown shaded in FIG. 3A associated with the second vector 44 are assigned a value one and this value is summed into the corresponding histogram bins 70. Consequently, the seventh histogram bin 70 has a value one, while the second through sixth histogram bin 70 has a value of one summed with a previous value of one for a resulting value of two.

Figure 3C:
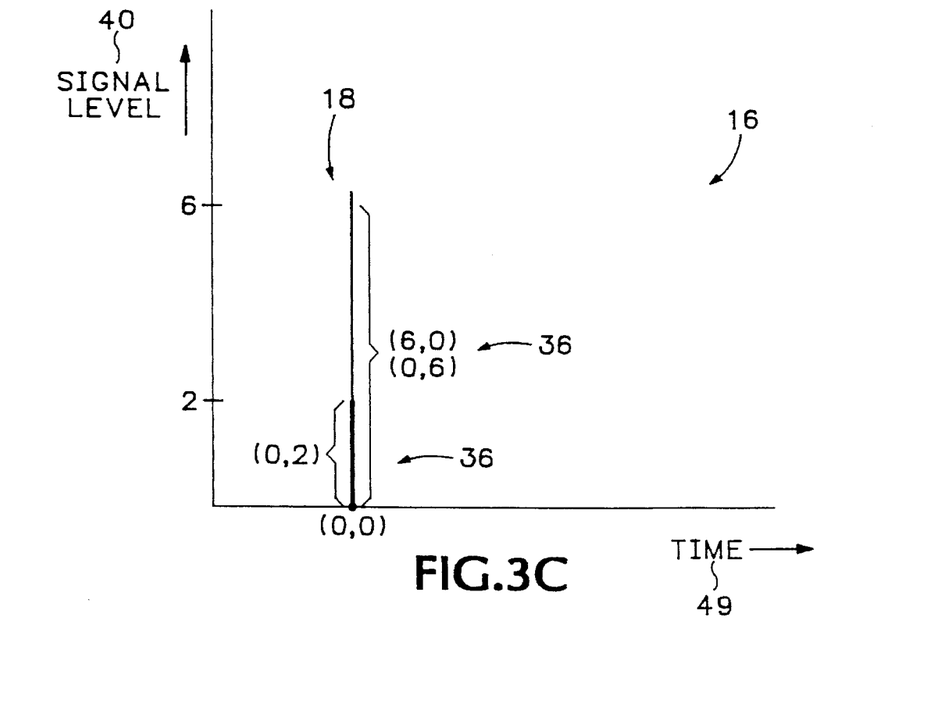
FIG. 3C is an exemplary representation of a display of the data set of FIG. 2A, according to the present invention.

In FIG. 3C, stage (c), the third vector 44 (0,0) is drawn having a value of weight equal to one. Only one unit box 57 is shown shaded for this pseudo vector 51, and correspondingly, only one histogram bin has summed therein a value of one, that is, the first histogram bin 70, for a resulting value of two.

In FIG. 3C, stage (d), the fourth vector 44 (0,2) is drawn having a value of weight equal to one. The first and second histogram bin therefore have summed therein a value of one, resulting in values of three for each.

After all vectors are drawn a histogram comprising the bins 70 is completed for the compression interval 20 containing the data of FIG. 3A. The values contained within the bins are then mapped to a column of the display pixel map 16 (FIG. 1).

Referring to FIG. 3C the column 18 of the display pixel map 16 is shown having the four vectors mapped thereto, as the vectors 36. The vectors 36 comprise pixels within the display of column 18 each having a degree of gradable visual characteristic determined by the value of their associated histogram bin.

The analog drawing technique described above provides maximum information content, but requires also a maximum amount of computation. The inflection drawing technique described above may require less computation, depending on the data; however, some information is discarded. Accordingly, a combination of the two techniques may be employed to present a selected balance of information retained and computation required. A combination of the analog and the inflection drawing techniques is referred to herein as a hybrid drawing technique.

Referring again to FIG. 3A, according to the hybrid drawing technique the weighted value, rather than being a fixed value is a function of the inverse of the vector magnitude between an associated pair of adjacent inflection points, in the same manner described for the analog drawing technique in connection with FIG. 2.

As will readily be appreciated, anytime a signal is divided into intervals, such as compression intervals, aliasing effects will occur when the period of the signal is close but not exactly equal to the length of a precisely fixed compression interval. Well known filtering techniques may then be advantageously employed to remove the aliasing effects in the compression of these signals. One such technique is to incorporate into the calculation of the data of a display column 18 (FIG. 1) a lesser weighted value for the corresponding data of the two adjacent columns 18, so that display of the compression interval is intentionally "blurred." Such a weighting scheme may weight the central column 18 twice as heavily as each adjacent column 18.

It is to be recognized that, while specific methods and apparatus have been shown as preferred embodiments of the invention, other circuit configurations, hardware and computation schemes such as may be implemented either in hardware or software may be utilized without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

We claim:

1. An apparatus for compressing a display of a waveform, the apparatus comprising:

a compression interval memory containing data representative of a waveform over an interval to be compressed for display;

an array of accumulating means with each accumulating means being associated with one or more pixels in a column of pixels, the column of pixels being associated with one quantum of a display pixel map;

means for choosing pairs of points from the data in the compression interval memory; and means for converting the chosen pair of points into a weight value and a range of pixels to be affected, the weight value being a function of a number of pixels in the range of pixels to be affected, and for causing each accumulating means associated with the range of pixels to be affected to add the weight value to a previous value in memory to produce an accumulated value, the accumulated value defining a gradable visual characteristic.

2. An apparatus according to claim 1 wherein the compression interval memory has a selectable length.

3. An apparatus according to claim 1 wherein the linear array of accumulating means comprises at least one adder and a plurality of memory units.

4. An apparatus according to claim 1 wherein each accumulating means comprises an adder and a memory unit.

5. An apparatus according to claim 1 wherein all of the accumulating means operate simultaneously in parallel.

6. An apparatus according to claim 1 wherein each of the accumulating means operate sequentially.

7. An apparatus according to claim 1 wherein the means for choosing sequentially chooses each pair of adjacent points in the compression interval.

8. An apparatus according to claim 1 wherein the weight value has an inverse relationship to a number "d" of pixels within the range of pixels to be affected.

9. An apparatus according to claim 1 wherein the weight value is determined by the relationship $V=W/(1+((W-1)\times d/R))$, where V is the weight value, W is a predetermined weight factor, d is the number of pixels affected, and R is the number of pixels in a column.

10. An apparatus according to claim 1 further comprising means for mapping the accumulated values into reduced range values, the reduced range values having less dynamic range than the accumulated values and therefore requiring fewer bits.

11. An apparatus according to claim 1 wherein the gradable visual characteristic is intensity.

12. An apparatus according to claim 1 wherein the gradable visual characteristic is color.

13. A method for compressing a display of a waveform, the method comprising the steps of:

providing a compression interval memory containing data representative of a waveform over an interval to be compressed for display;

choosing pairs of points from the data in the compression interval memory; and converting the chosen pair of points into a weight value and a range of pixels to be affected within a column of pixels associated with one quantum of a display axis map, the weight value being a function of a number of pixels in the range of pixels to be affected; and accumulating the weight value for each pixel within the range of pixels to be affected to produce an accumulated value, the accumulated value defining a gradable visual characteristic.

14. A method according to claim 13 further comprising the preliminary step of selecting a length for the compression interval memory.

15. A method according to claim 13 wherein the accumulating step comprises the steps of adding the weight value to a stored value; and storing the result of the adding step as an accumulated value.

16. A method according to claim 13 wherein the choosing, converting, and accumulating steps are repeated for each pair of adjacent points in the compression interval.

17. A method according to claim 13 wherein the weight value has an inverse relationship to a number "d" of pixels within the range of pixels to be affected.

18. A method according to claim 13 wherein the weight value is determined by the relationship $V=W/(1+((W-1)\times d/R))$, where V is the weight value, W is a predetermined weight factor, d is the number of pixels affected, and R is the number of pixels in a column.

19. A method according to claim 13 further comprising the step of mapping the accumulated values into reduced range values, the reduced range values having less dynamic range than the accumulated values and therefore requiring fewer bits.

20. An apparatus according to claim 13 wherein the gradable visual characteristic is intensity.

21. An apparatus according to claim 13 wherein the gradable visual characteristic is color.

* * * * *